United States Patent
Silvus

(10) Patent No.: US 7,174,485 B2
(45) Date of Patent: Feb. 6, 2007

(54) REVERSE ERROR CORRECTION CODING WITH RUN LENGTH LIMITED CONSTRAINT

(75) Inventor: Gregory L. Silvus, Boulder, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 545 days.

(21) Appl. No.: 10/719,132

(22) Filed: Nov. 21, 2003

(65) Prior Publication Data

US 2005/0138522 A1 Jun. 23, 2005

(51) Int. Cl.
*H03M 13/47* (2006.01)
*H03M 7/46* (2006.01)

(52) U.S. Cl. .......................... 714/701; 341/59; 714/759

(58) Field of Classification Search .................. 341/59; 714/701, 759, 784; H03M 13/47
See application file for complete search history.

(56) References Cited

U.S. PATENT DOCUMENTS

| | | | |
|---|---|---|---|
| 5,412,666 A * | 5/1995 | Squires et al. ............... | 714/755 |
| 5,610,808 A * | 3/1997 | Squires et al. .................. | 700/2 |
| 5,991,911 A * | 11/1999 | Zook .......................... | 714/758 |
| 6,009,549 A | 12/1999 | Bliss et al. | |
| 6,018,304 A | 1/2000 | Bessios | |
| 6,201,485 B1 | 3/2001 | McEwen | |
| 6,210,779 B1 | 4/2001 | Watanabe | |
| 6,259,384 B1 | 7/2001 | McEwen | |
| 6,417,788 B1 | 7/2002 | McEwen | |
| 6,587,294 B1 | 7/2003 | Ushio et al. | |
| 2002/0034277 A1 | 3/2002 | Laner | |
| 2002/0047788 A1 | 4/2002 | McEwen et al. | |
| 2002/0049949 A1* | 4/2002 | Shimoda ...................... | 714/755 |
| 2003/0012110 A1 | 1/2003 | Senshu | |
| 2003/0041298 A1 | 2/2003 | Bruner et al. | |

FOREIGN PATENT DOCUMENTS

| | | |
|---|---|---|
| EP | 1211682 A2 | 6/2002 |
| JP | 8204573 A2 | 8/1996 |
| JP | 8221906 A2 | 8/1996 |
| JP | 10222940 A2 | 8/1998 |
| JP | 11007736 A2 | 1/1999 |
| JP | 2002025203 A2 | 1/2000 |
| JP | 2000113606 A2 | 4/2000 |
| JP | 2002027464 A2 | 1/2002 |
| JP | 2002093057 A2 | 3/2002 |
| JP | 2000361529 | 6/2002 |
| JP | 2002170333 A2 | 6/2002 |
| WO | WO 02/01561 A2 | 1/2002 |

OTHER PUBLICATIONS

Saeki, K. et al.; Optimal combination of detection and error correction coding for magnetic recording; Magnetics, IEEE Transactions on; Mar. 2001; vol. 37, Issue: 2, Part 1; pp. 708-713.*

(Continued)

Primary Examiner—R. Stephen Dildine
(74) Attorney, Agent, or Firm—Westman, Champlin & Kelly, P.A.

(57) ABSTRACT

A method and apparatus for communicating data is provided. The data is encoded in accordance with a run length limited (RLL) code. A seed is appended to the RLL encoded data. The seed can be used to alter the error correction code (ECC) parity to meet an RLL constraint.

31 Claims, 9 Drawing Sheets

OTHER PUBLICATIONS

El-Soudani, M.S.; Multistage coding for data storage systems; Networks, 1995. Theme: 'Electrotechnology 2000: Communications and Networks'. [in conjunction with the] International Conference on Information Engineering., Proceedings of IEEE Singapore International Conference on; Jul. 3-7, 1995; pp. 322-326.*

* cited by examiner

REVERSE ERROR CORRECTION CODING WITH RUN LENGTH LIMITED CONSTRAINT

FIELD OF THE INVENTION

The present invention relates generally to data communication and/or data storage. More particularly, the present invention relates to systems where error correction coding occurs after any constrained coding.

BACKGROUND OF THE INVENTION

In the fields of data storage and communication, data reliability is critical. Specifically, it is important that data transmitted or stored is substantially free from errors when that data is received or retrieved from storage, respectively. Traditional methods for ensuring data reliability have included appending check bits or parity symbols to data prior to transmission or storage whereby upon receipt of the data, the parity symbols may be used to detect and correct errors in the data. A symbol is generally a unit of data, and typically includes a number of bits. The parity symbols add redundancy to data, which is transmitted via and/or stored on a potentially noisy medium. One broad class of redundant error correction techniques is error correction coding (ECC). One class of commonly used ECC algorithms is the Reed-Solomon (RS) class of algorithms.

Another coding technique called modulation or constrained coding is typically used after data is encoded with ECC. The term "modulation coding" refers generally to encoding a data stream to meet a constraint, one or more properties which may be useful or necessary for reception or retrieval of data through a communication or data storage channel. One particular example of modulation coding is run-length limited (RLL) coding. RLL coding adds redundancy and is most often used to guarantee that timing information is present in the data stream when the data stream is received (in the case of data transmission) or retrieved (in the case of data storage). A data stream in its analog form generally includes a series of pulses, often, electrical voltage pulses. The presence of a pulse at a particular bit time corresponds to the presence of a binary one in the RLL coded data stream. Other, more complex, signaling techniques exist and the claims herein apply to those schemes, too. RLL coding provides timing recoverability by encoding the data stream such that the number of consecutive binary zeros in the data stream is limited to a desired maximum number, or k-constraint. The k-constraint ensures that the space between pulses is not too long, and thereby provides timing recoverability because the space between pulses does not carry any timing information. Many variations of RLL codes exist that provide a wide range of k-constraints. In current approaches, a data stream is ECC coded prior to RLL coding. Several problems have been identified with implementing ECC encoding prior to RLL encoding, and more specifically the combination of ECC and RLL encoding in the same system have been identified as causing problems.

Both RLL codes and ECC have code rates that are less than one. Code rate refers to the quotient of the number of input data bits prior to encoding, and the number of data bits after encoding. Any time the number of output bits is less than the number of input bits, the code rate is less that one, and the code is said to introduce redundancy to the system. The overall code rate is the product of the RLL code rate and the ECC code rate. The redundancy added by the RLL code provides timing recovery information; the redundancy added by the ECC provides the ability to correct errors in the data stream. The code rate is a measure of the redundancy introduced into the data. In general, more timing recovery information and error correction information results in a penalty of decreased code rate. Conversely, as the code rate increases, the robustness of the timing information and the ECC decreases. In other words, for ECC as more parity symbols are added to input data during encoding, higher reliability can be achieved. However, as higher reliability is achieved by adding parity symbols, the code rate goes down. In general, a lower code rate adversely impacts design parameters, including storage density requirements (in the case of data storage) and bandwidth requirements (in the case of data transmission).

One problem that has been recognized with respect to RLL coding is error propagation. Error propagation refers to an effect in which errors introduced to data in a data block may be spread to other parts of the data block after RLL decoding. Error propagation due to RLL decoding can drastically reduce data reliability because data errors grow in size (propagate) through the RLL decoding process (which is generally nonlinear) and thereby may corrupt multiple code symbols. An interesting fact about ECC is that the extra parity and the original data work together to correct errors that occur anywhere in the data stream. A corrupted data symbol is just as detrimental as a corrupted parity symbol. In short, error propagation refers to the fact that more errors are seen on the output of the RLL decoder than on the input.

One approach that has been used to limit the effects of error propagation is referred to as reverse ECC. As discussed earlier, a common approach is introducing the ECC code prior to the RLL code. Reverse ECC involves RLL encoding of input data prior to ECC coding. In other words, input data is RLL encoded and subsequently ECC encoded. Since ECC coding adds extra bits, i.e., the parity symbols, reverse ECC requires another step, whereby ECC parity symbols are separately RLL encoded, because the parity symbols may otherwise violate the specified run-length constraint for binary zeros. Although the Reverse ECC approach may limit error propagation, it requires additional logic to implement the second RLL code. The second RLL code has a lower rate than the primary RLL code and requires packing and unpacking logic in the controller and extra gates for its implementation. Implementation of Reverse ECC typically results in greater die size requirements in integrated circuits. Additionally, for a given degree of data reliability, code rate may be reduced because the second RLL encoding increases the block redundancy beyond the amount required for standard (i.e., not reverse) RLL and ECC implementation.

SUMMARY OF THE INVENTION

A method and apparatus for communicating data is provided. The data is encoded in accordance with a run length limited (RLL). A seed is appended to the RLL encoded data. The seed alters the parity values of the error correction code (ECC) so that they meet an RLL constraint.

DETAILED DESCRIPTION OF ILLUSTRATIVE EMBODIMENTS

Embodiments of the present invention are described with reference to a series of figures. Generally, embodiments of the present invention relate to systems and methods incorporated in a computing device for encoding and/or decoding data. More particularly, the systems and methods implement a Reverse ECC code without requiring a second RLL code. Still more particularly, the systems and methods introduce a seed into the encoded data such that the ECC parity meets an RLL constraint.

Figure 1:
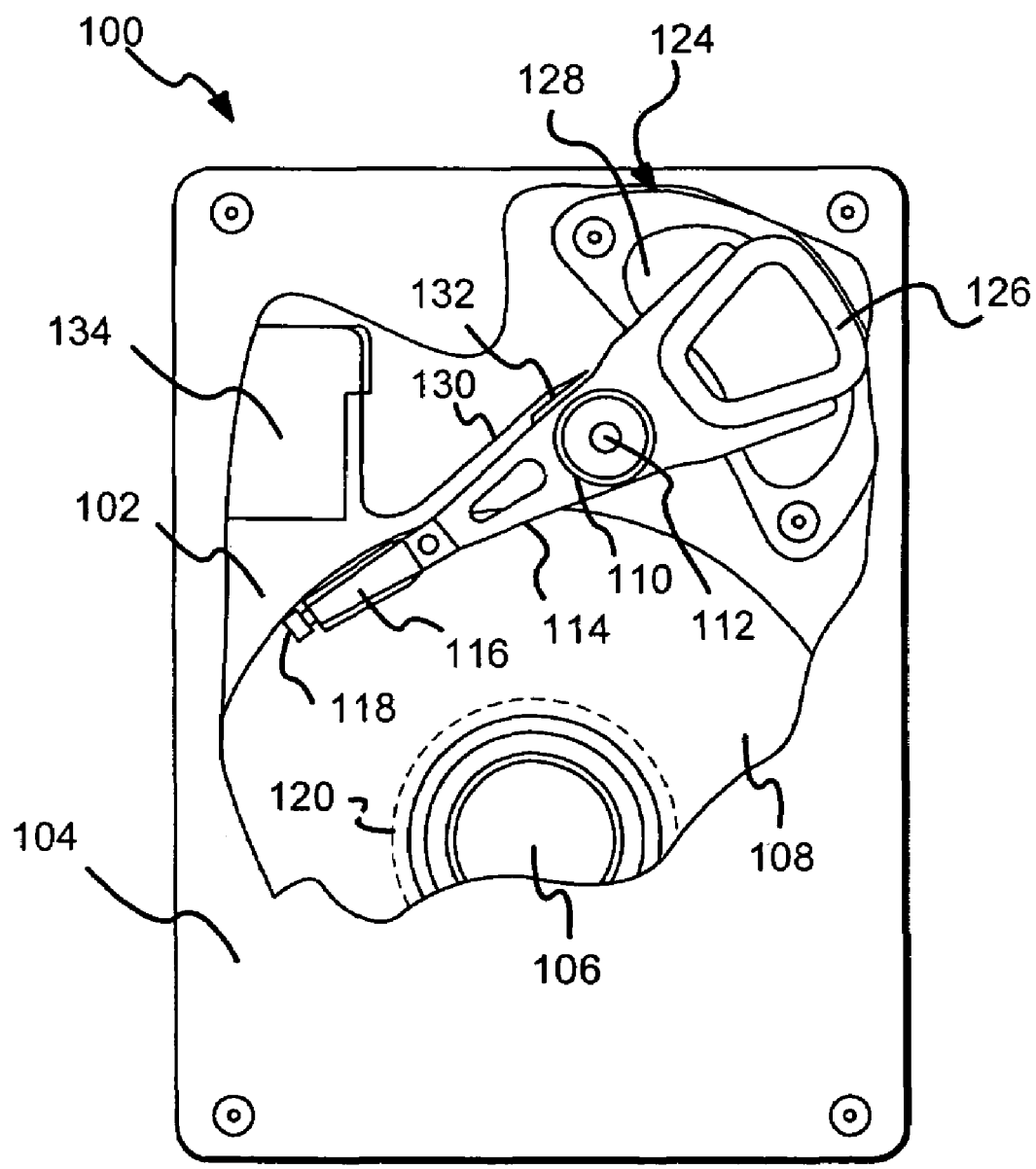
FIG. 1 is a plan view of a disc drive incorporating a preferred embodiment of the present invention showing the disc drive's primary internal components.

A disc drive 100 constructed in accordance with a preferred embodiment of the present invention is shown in FIG. 1. The disc drive 100 includes a baseplate 102 to which various components of the disc drive 100 are mounted. A top cover 104, shown partially cut away, cooperates with the baseplate 102 to form an internal, sealed environment for the disc drive in a conventional manner. The components include a spindle motor 106, which rotates one or more discs 108 at a constant high speed. Information is written to and read from tracks on the discs 108 through the use of an actuator assembly 110, which rotates during a seek operation about a bearing shaft assembly 112 positioned adjacent the discs 108. The actuator assembly 110 includes a plurality of actuator arms 114 which extend towards the discs 108, with one or more flexures 116 extending from each of the actuator arms 114. Mounted at the distal end of each of the flexures 116 is a head 118, which includes an air bearing slider enabling the head 118 to fly in close proximity above the corresponding surface of the associated disc 108.

During a seek operation, the track position of the heads 118 is controlled through the use of a voice coil motor (VCM) 124, which typically includes a coil 126 attached to the actuator assembly 110, as well as one or more permanent magnets 128 which establish a magnetic field in which the coil 126 is immersed. The controlled application of current to the coil 126 causes magnetic interaction between the permanent magnets 128 and the coil 126 so that the coil 126 moves in accordance with the well-known Lorentz relationship. As the coil 126 moves, the actuator assembly 110 pivots about the bearing shaft assembly 112, and the heads 118 are caused to move across the surfaces of the discs 108.

The spindle motor 106 is typically de-energized when the disc drive 100 is not in use for extended periods of time. The heads 118 are moved over park zones 120 near the inner diameter of the discs 108 when the drive motor is de-energized. The heads 118 are secured over the park zones 120 through the use of an actuator latch arrangement, which prevents inadvertent rotation of the actuator assembly 110 when the heads are parked.

A flex assembly 130 provides the requisite electrical connection paths for the actuator assembly 110 while allowing pivotal movement of the actuator assembly 110 during operation. The flex assembly includes a printed circuit board 132 to which head wires (not shown) are connected; the head wires being routed along the actuator arms 114 and the flexures 116 to the heads 118. The printed circuit board 132 typically includes circuitry for controlling the write currents applied to the heads 118 during a write operation and a preamplifier for amplifying read signals generated by the heads 118 during a read operation. The flex assembly terminates at a flex bracket 134 for communication through the baseplate 102 to a disc drive printed circuit board (not shown) mounted to the bottom side of the disc drive 100.

In the embodiment shown in FIG. 1, the write head 118 in combination with current-controlling circuitry may generally be referred to as a communication module for communicating data onto the disc 108. The read head 118 in combination with the preamplifier may be referred to as a retrieving module, whereby data is retrieved from the disc 108. In general, a communication module includes any hardware, software, and/or firmware operable to communicate data via or to a medium. Likewise, in general, a retrieving module includes any hardware, software, and/or firmware operable to receive data from the medium. While embodiments described herein are directed at use in a disc drive, it is to be understood that other types of mediums, such as communications channels, and devices, such as transmitters and receivers, may advantageously employ embodiments of the present invention.

Figure 2:
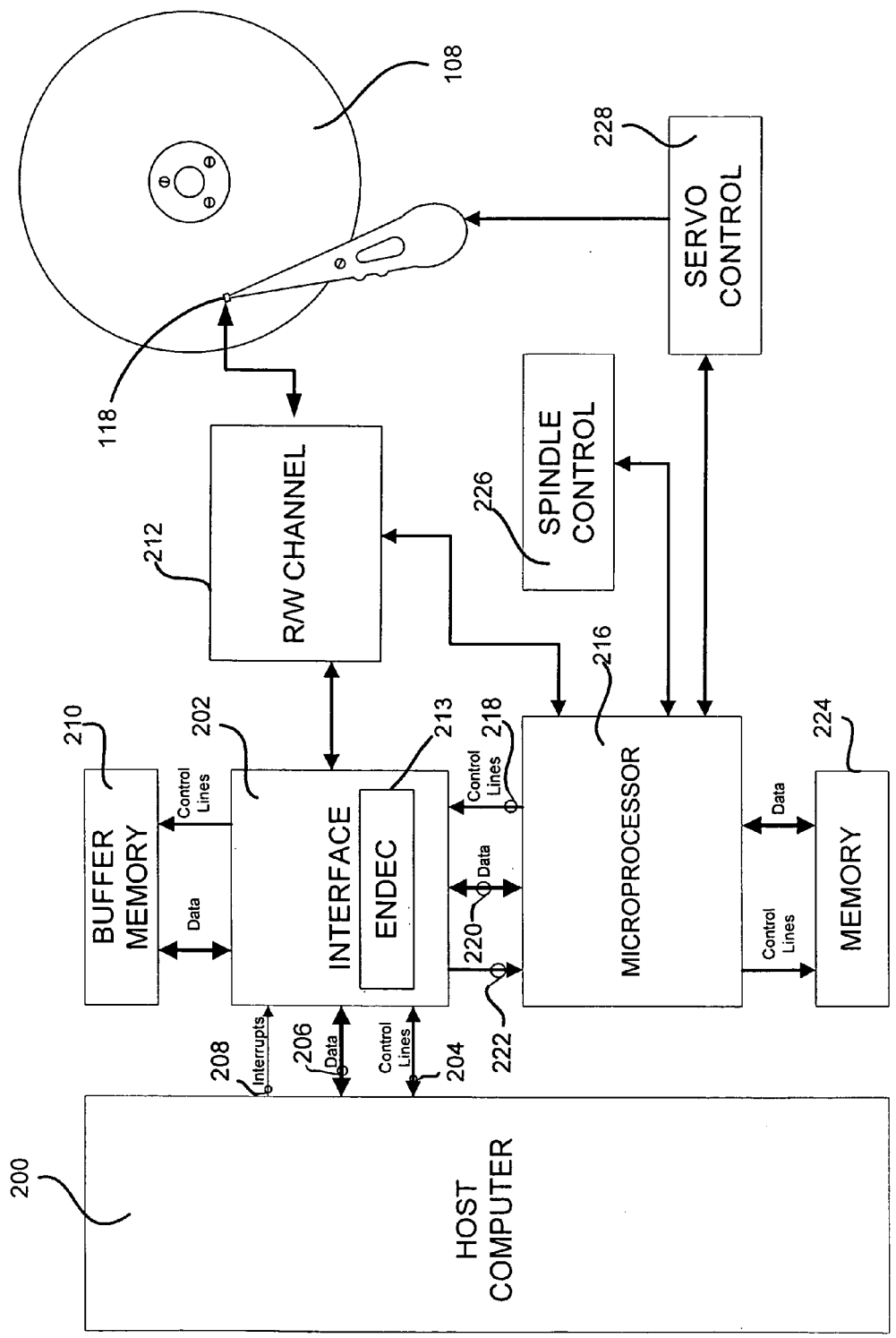
FIG. 2 is a functional block diagram of the disc drive of FIG. 1 in accordance with a preferred embodiment of the present invention.

Referring now to FIG. 2, shown therein is a functional block diagram of the disc drive 100 of FIG. 1, generally showing the main functional circuits which are typically resident on a disc drive printed circuit board and which are used to control the operation of the disc drive 100. As shown in FIG. 2, the host 200 is operably connected to an interface application specific integrated circuit (interface) 202 via control lines 204, data lines 206, and interrupt lines 208. The interface 202 typically includes an associated buffer 210, which facilitates high-speed data transfer between the host 200 and the disc drive 100. Data to be written to the disc drive 100 are passed from the host to the interface 202 and then to a read/write channel 212, which encodes and serializes the data.

In an embodiment, the interface 202 includes a encoder/decoder (ENDEC) 213 for encoding and decoding data. The ENDEC 213 employs unique systems and methods for ensuring data reliability and timing recovery for a given code rate. The coding configuration implemented by the ENDEC 213 is described in more detail below.

The read/write channel 212 also provides the requisite write current signals to the heads 118 via the write current controlling circuitry on printed circuit board 132. To retrieve data that has been previously stored by the disc drive 100, read signals are generated by the heads 118 and provided, via the preamplifier on printed circuit board 132, to the read/write channel 212, which processes and outputs the retrieved data to the interface 202 for subsequent transfer to the host 200.

As also shown in FIG. 2, a microprocessor 216 is operably connected to the interface 202 via control lines 218, data lines 220, and interrupt lines 222. The microprocessor 216 provides top level communication and control for the disc drive 100 in conjunction with programming for the microprocessor 216 which is typically stored in a microprocessor memory 224. The MEM 224 can include random access memory (RAM), read only memory (ROM) and other sources of resident memory for the microprocessor 216. Additionally, the microprocessor 216 provides control signals for spindle control 226, and servo control 228.

Figure 3:
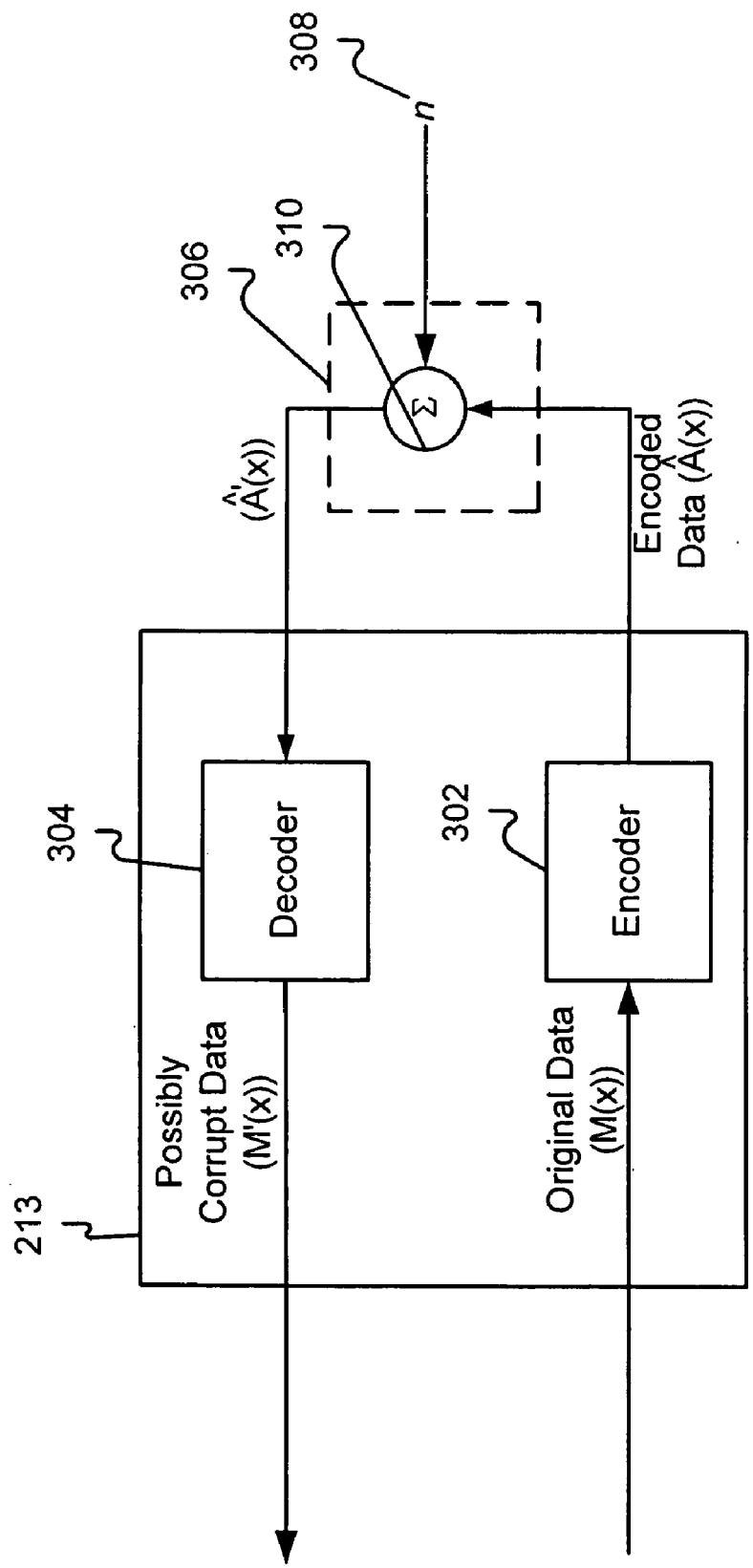
FIG. 3 is a module diagram illustrating functional modules of a ENDEC as in FIG. 2 in an exemplary embodiment of the present invention.

One embodiment of the ENDEC 213 (FIG. 2) is illustrated in FIG. 3 in combination with a communication or storage medium. In this particular embodiment, the ENDEC 213 includes an encoder 302, and a decoder 304, which encode and decode data respectively. The encoder 302 receives input or user data, M(x), and outputs encoded or channel data, Â(x). The encoded data, Â(x), is communicated via a noisy medium 306 (e.g., the disc 108 of FIG. 1). The noisy medium may be any communication channel or storage medium wherein the encoded data experiences noise or any disturbance that may impart errors in the encoded data, Â(x). Noise as used herein refers to any phenomenon, random or deterministic, associated with the medium 306 that tends to cause information (e.g., bits) in the encoded data to change. As illustrated, the medium 306 imparts noise 308 upon the encoded data, Â(x). In the particular embodiment in FIG. 3, the medium 306 is abstracted as including an addition function 310, whereby the noise 308 is added to the encoded data, Â(x). It is to be understood, however, that in general, noise can have other effects upon Â(x) besides, or in combination with, additive effects. In general, it can be said that in direct ECC, the ECC coding is done in the CODEC of the interface and the RLL encoding is done in the ENDEC of the channel. On the other hand, in reverse ECC, the ECC coding AND the RLL coding are done in the interface CODEC.

With regard to the noisy medium 306, an example of a noisy medium is exhibited as part of a disc drive in FIG. 2. Noise may be imparted on data in the disc drive 100 at any point along the data path. By way of example, and not limitation, the noisy medium 306 in the disc drive 100 may include the disc 108 shown in FIG. 2. After data is written to the disc 108, disturbances in the disc drive 100 may cause errors to arise in the data stored on the disc 108. The noisy medium 306 may further include the read/write channel 212 and the read/write head 118. Thus, noise may be imparted upon data when the data is in the read/write channel 212 before or after the data is written to the disc 108.

With regard to the decoder 304, the decoder 304 receives the communicated encoded data Â'(x) from the channel as it may have been changed by the medium. The decoder 304 uses encoding data that was included by the encoder 302, to determine the original data M(x) from the encoded data, Â'(x). The output of the decoder 304 is M'(x), which may differ from M(x) if uncorrectable errors were imparted on Â(x) as it was transferred over the medium 306. The decoder 304 is designed to be able to correct up to a specified number of errors; however, if more errors occur than the specified number, then the decoder 304 is not able to derive M(x), but rather M'(x). In one embodiment, the decoder 304 performs operations substantially in reverse of the operation performed by the encoder 302. In another embodiment, discussed below, the decoder 304 includes additional decoding operations to identify erasure data that may become available in Â'(x) due to unique attributes of the encoding process.

Figure 4:
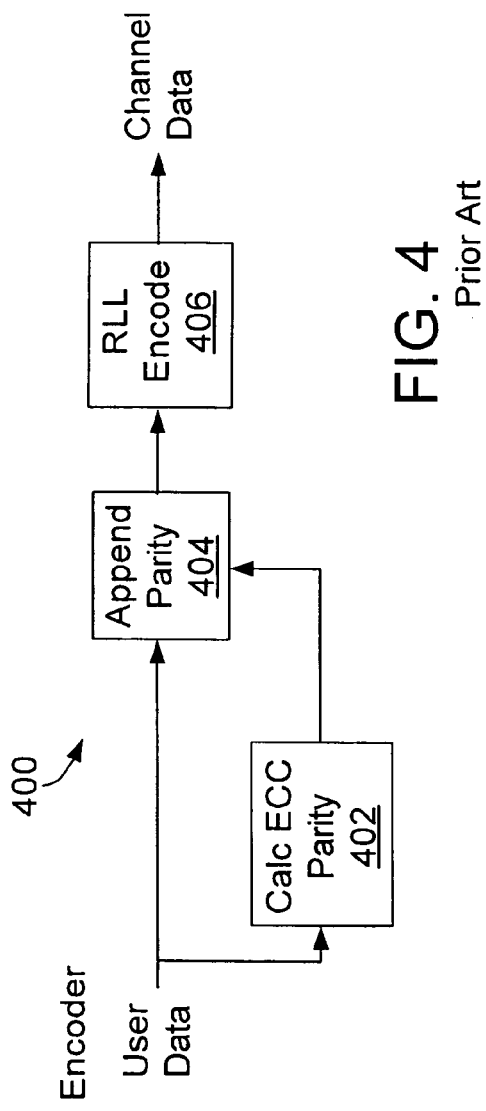
FIG. 4 is a simplified block diagram of a prior art encoder.

There are two general configurations for correction coding, direct error correction coding (ECC) and Reverse error correction coding (Reverse ECC or CCE). FIG. 4 is a simplified diagram of a prior art direct ECC encoder 400. Encoder 400 receives user data and a ECC parity is calculated at block 402. The calculated parity is appended at block 404. The user data with appended parity is run length limited (RLL) encoded at block 406 to provide the channel data. The run length limited encoding ensures that the number of zero symbols in the data is less than a predetermined maximum in order to ensure timing data exists in the channel data.

Figure 5:
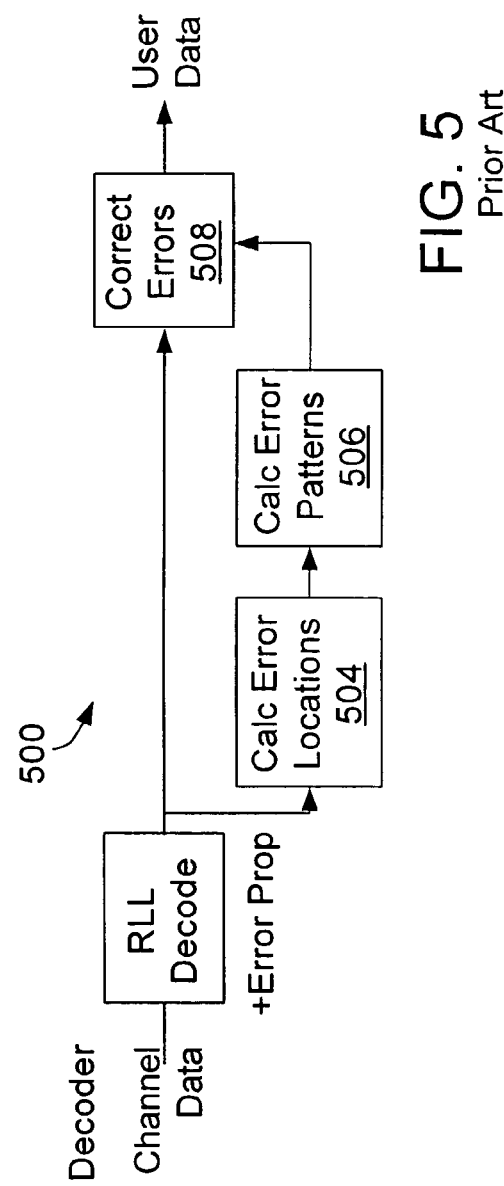
FIG. 5 is a block diagram of a prior art decoder.

Typically, the user data is first error detection coded (EDC), then error correction coded (ECC). Often, a data scrambling operation occurs between the ECC encoding step and the RLL encoding step. FIG. 5 is a simplified block diagram showing a decoder 500 for direct ECC decoding. In FIG. 5, the channel data is first RLL decoded at block 502. At block 504, the location of errors in the data is calculated. Due to the nature of the RLL decoding, a greater number of errors exist after RLL Decode block 502 than before the same block, i.e., errors are propagated into block 504. At block 506, error patterns are calculated and used to correct errors in the channel data at block 508 to thereby provide a user data output.

Figure 6:
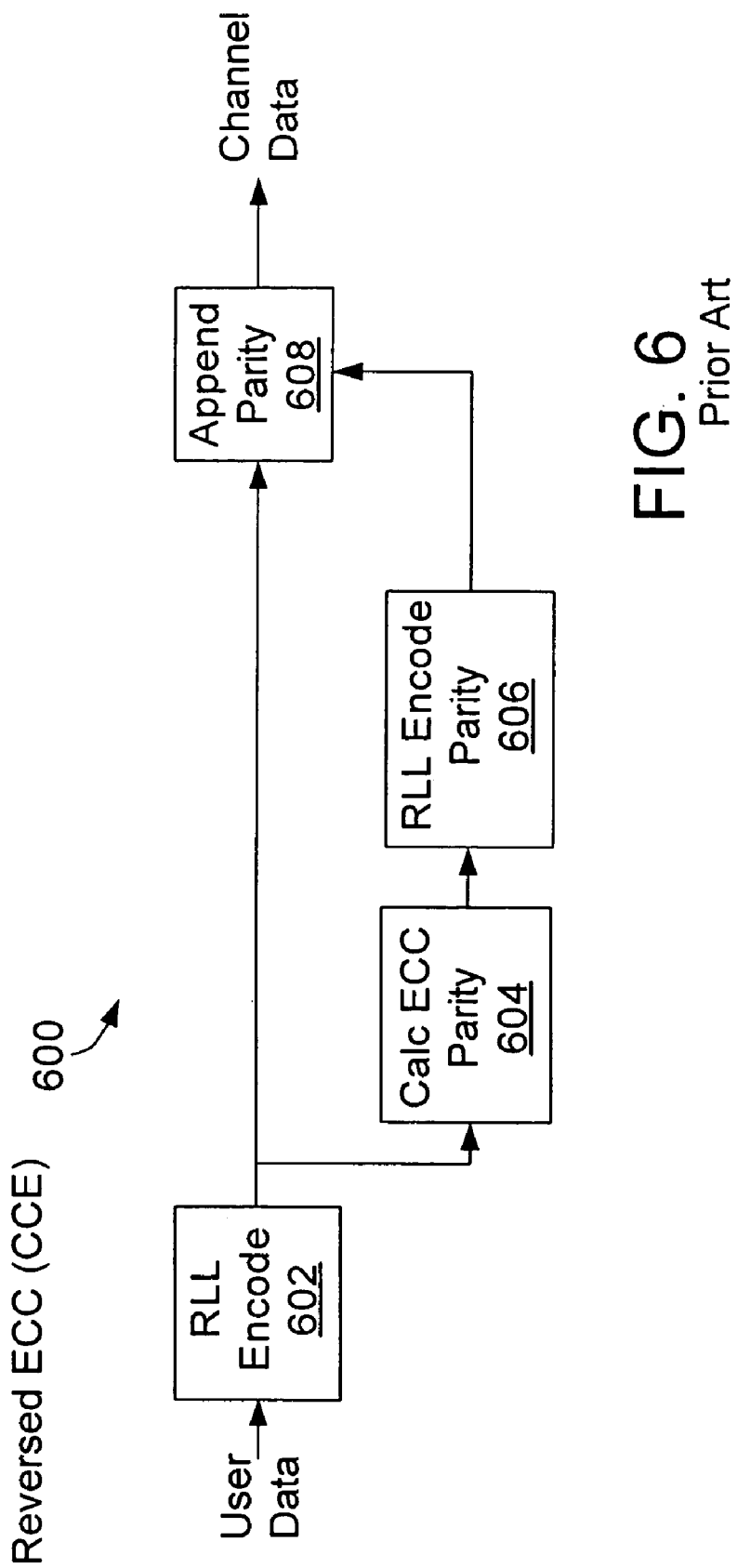
FIG. 6 is a block diagram of a prior art Reverse ECC (CCE) encoder.
Figure 7:
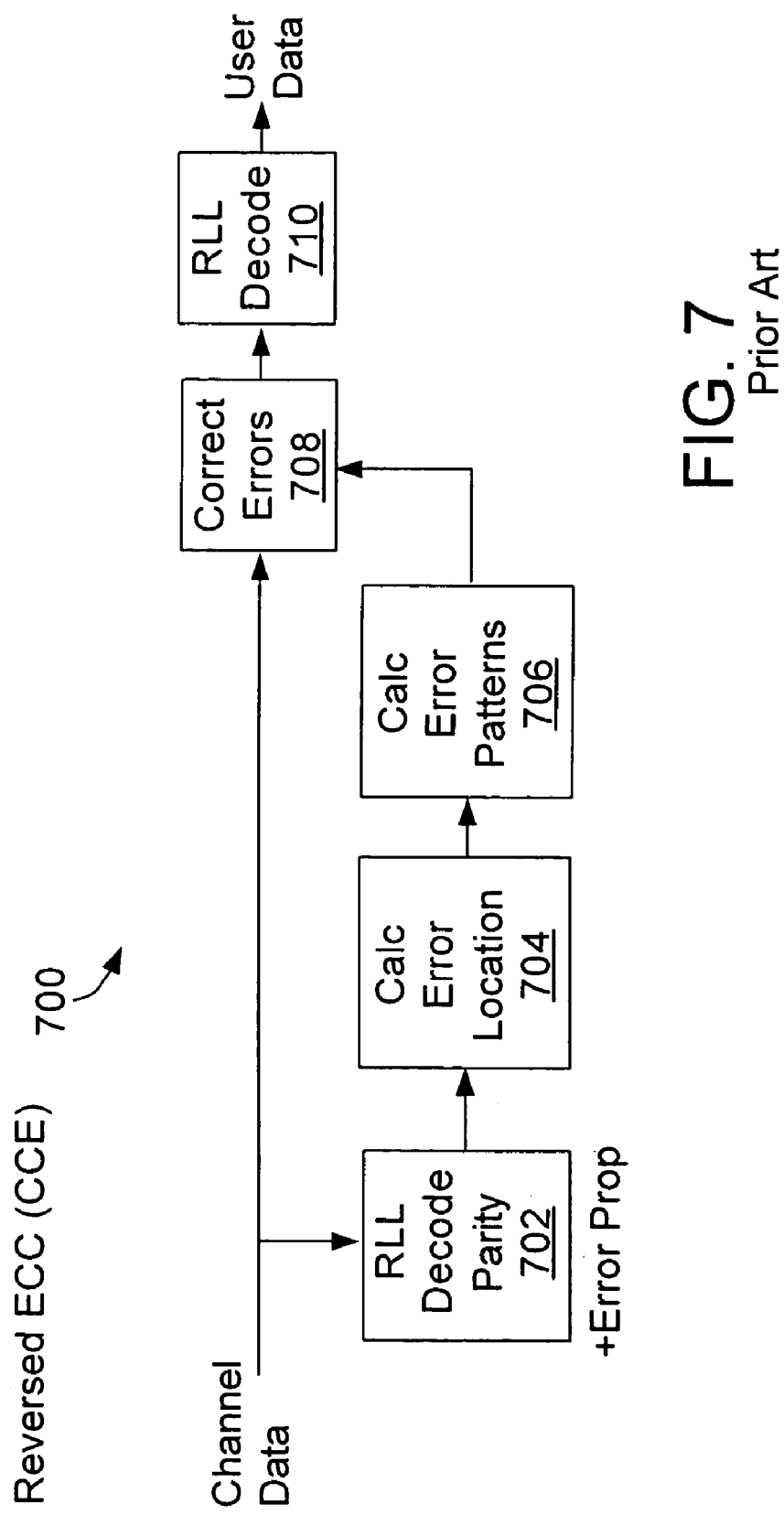
FIG. 7. is a block diagram of a prior art Reverse ECC (CCE) decoder.

In contrast to FIG. 4, FIG. 6 is a simplified block diagram of an encoder 600 in accordance with Reverse ECC (or CCE) encoding. With this method of encoding data, the scrambled user data is first RLL encoded at block 602. After RLL encoding, the ECC parity is calculated at block 604. However, in order to ensure that the RLL constraints are met, the ECC parity must also be RLL encoded at block 606. The RLL encoded parity is appended to the data at block 608 to thereby produce the channel data. FIG. 7 is a simplified block diagram of a decoder 700 for decoding Reverse ECC (or CCE) encoded data. At block 702, the channel data parity is RLL decoded from the channel data. One advantage of Reverse ECC coding is that error propagation only occurs on the parity symbols, rather than all channel symbols as with direct ECC. Although decoding the RLL code transforms small errors into larger errors thereby making the ECC less efficient at error correction, the propagation is limited to a subset of the total number of symbols. At block 704, the error locations are calculated and at block 706, the error patterns are calculated based upon the RLL decoded parity data. At block 708, errors in the channel data are corrected and at block 710, the data is RLL decoded to provide a user data output.

One disadvantage of the CCE configuration is that a second RLL code is required. This code has a lower rate than the primary RLL code and requires packing and unpacking logic in the controller and extra gate logic for implementing the code. The lower code rate degrades system performance, because more channel data must be packed into the same amount of space. The more tightly packed the data is, the more prone it is to containing errors due to system noise. Additionally, the extra logic increases the complexity, cost and likelihood of errors arising. The present invention provides a Reverse ECC (or CCE) code which does not require a second RLL code in addition to the primary RLL code.

Figure 8:
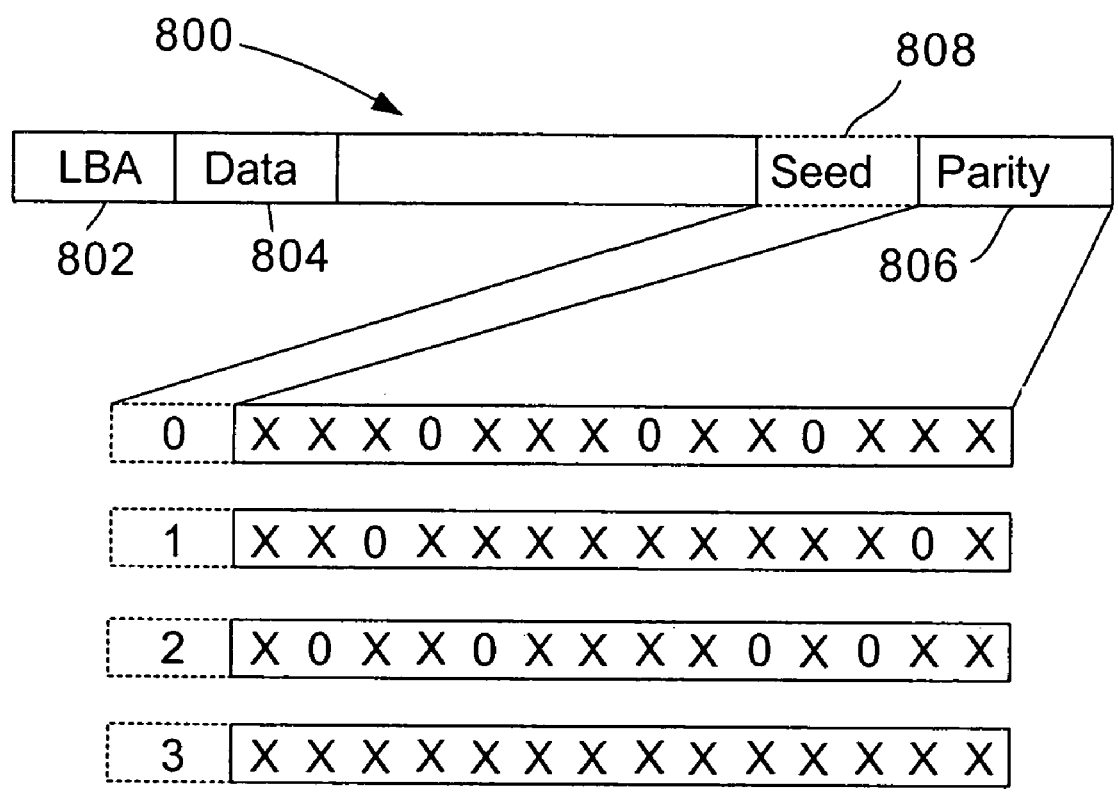
FIG. 8 shows fields in channel data in accordance with the present invention.

FIG. 8 is a diagram which illustrates the structure of a sector data 800 in accordance with the present invention. Sector data 800 includes an LBA (Logical Block Address, i.e., the location of the data as far as the host is concerned) field 802, a data field 804, and a parity field 806. Further, sector data 800 includes an additional seed field 808 which contains a seed value. The seed is selected such that at the parity field is in accordance with a desired RLL constraint. For example, the seed can be selected such that no zero symbols occur in the parity field.

In general, for ECC parity computation, the logical block address is used as a "seed". The LBA is prepended to the data before the parity computation takes place. Prior to writing the data onto the disc surface, the prepended LBA data is removed. The LBA has been encoded into the parity, but does not exist as part of the data record. Therefore, the LBA data does not decrease storage efficiency. During readback, the LBA value is known by the host and is prepended to the encoded data prior to decoding. This allows the original data to be recovered. If the LBA is incorrect (perhaps because the data was written to the wrong portion of the disc), error correction coding can be used to correct the information and ensure integrity of both the location and the data.

With the present invention, a seed in addition to the LBA is inserted into the data prior to the parity computation. The seed value is selected such that the parity computation will yield data that meets a desired RLL constraint. For example, the initial seed value can comprise a zero, if the computed parity contains any zero symbols, the RLL constraint has been violated and a different seed symbol is inserted and new parity determined. In one implementation, the full-complexity parity recomputation is not necessary. Specifically, with a linear Reed-Solomon (RS) error correcting code, any codeword that is added to another codeword will result in a valid codeword. For example, in order to change the "zero" seed to a "one" seed, a second codeword is generated having zero symbols in the LBA and data fields and a "one symbol" in the seed field. The resultant parity values for this data are added to the previously calculated parity field. This resultant codeword can be checked to determine if it meets the RLL constraint.

FIG. 8 illustrates the seed selection process. Four example seed values are shown in FIG. 8, having values of 0, 1, 2, and 3. The resultant parity values are also shown. An X indicates a non-zero symbol while a zero indicates a symbol containing all zeroes. The parity values for the seeds 0, 1 and 2 all contain at least one zero symbol and therefore do not meet the RLL constraint. However, in this example, a seed value of 3 yields a parity having no zero symbols and thus meets the RLL constraint. When the data is written to the disc, the seed does not have to be written, if it is not, storage density is slightly reduced.

For the decode process, for example, if the seed was not written the controller initially assumes that a "zero" seed was appended. If this assumption is incorrect, the error correction code can correct the appended seed symbol. If the system needs all available error correction coding in order to correct the data, the controller can cycle through values of the seed until correction is ultimately achieved.

Figure 9:
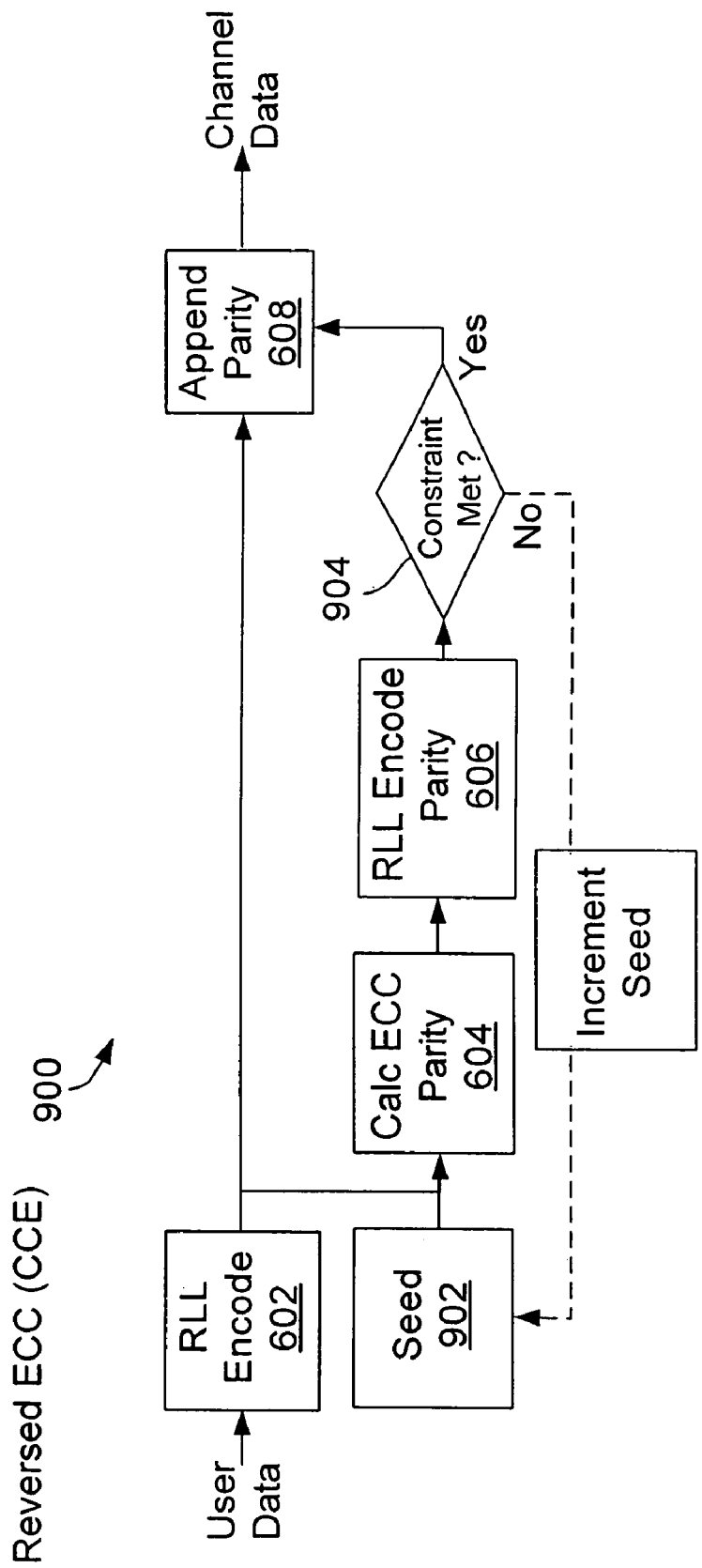
FIG. 9 is a block diagram of a Reverse ECC (CCE) encoder in accordance with the present invention.
Figure 10:
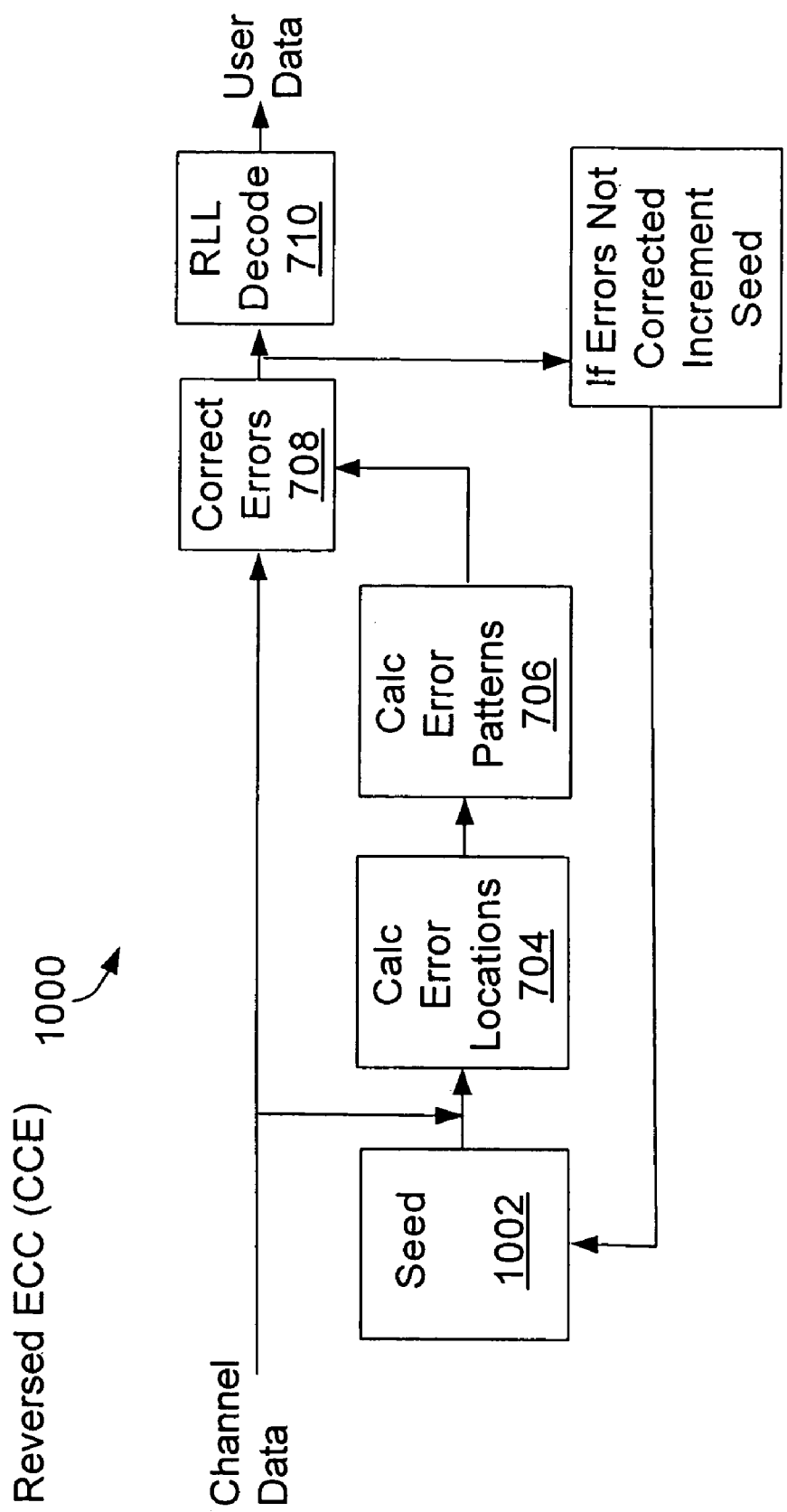
FIG. 10 is a block diagram of a Reverse ECC (CCE) decoder in accordance with the present invention.

FIG. 9 is simplified block diagram of a Reserve ECC encoded 900 in accordance with the present invention. Encoder 900 is similar to the prior art encoder 600 shown in FIG. 6, however, a seed is introduced at block 902 prior to calculating the ECC parity. As discussed above, the value of the seed can be determined through an iterative process. Specifically, at block 904, the parity is compared to the constraint requirement. If the constraint is not met, a new seed is selected at block 902. Blocks 902, 604, 606 and 904 generally provide a seed selection module. FIG. 10 is a simplified block diagram of a Reverse ECC decoder 1000 in accordance with the present invention. Decoder 1000 is similar to prior art decoder 700 shown in FIG. 7. However, the RLL parity decode is not required in decoder 1000 and there is no resultant error propagation. Instead, a seed value is introduced at block 1002 prior to calculation of the error locations at block 704.

Implementation of the present Reverse error correction coding technique will now be explained in more detail. It will be shown that the desired RLL constraint can always be met. During operation, the user data is initially error detection code (EDC) encoded, scrambled and run length limited (RLL) encoded. The LBA data is prepended to the user data and an initial seed is appended. The error correction code (ECC) parity symbols are then computed. Note that the choice of where to place the seed value is arbitrary. It need not be appended to the data and can be placed anywhere in the data sequence, including before the LBA data. When the data is written to the disc, the LBA data and the seed data are removed and only the user data and ECC parity are written. Therefore, the LBA data does not need to meet a run length constraint. The user data already meets an RLL constraint because it has been RLL encoded. However, if the ECC parity contains any zero symbols, an assumption can be made that it violates the RLL constraint. There may be some parity values that include zero symbols that do meet with run length limited constraint. However, the assumption that the presence of any zero symbol violates the constraint can be used to reduce computational requirements.

If the ECC parity has any zero symbols, or otherwise violates an RLL constraint, another seed must be used. When the Reed-Solomon code is implemented as a linear code, the sum of any two codewords will necessarily provide a valid codeword. Therefore, the ECC parity values can be predetermined for data sectors in which the LBA is zero, the user data is zero and the seed has any desired value, for example, 1, 2, 3, etc. The ECC parity with a seed equal to one is read from system memory and added to the current parity calculation. This will yield a new, valid parity value. If the new parity also violates the RLL constraint another seed value can be tested. This process continues until the constraint is met.

It can be shown that a seed value that will yield parity having no zero symbols can always be obtained. For example, if n is the block size of the data including LBA, user data, EDC symbols, seed and ECC symbols, k is the size of the message (LBA, user data and seed), and t is the number of corrections the Reed-Solomon ECC is capable of performing in normal operation. In accordance with Reed-Solomon coding, n must be smaller than or equal to $(2^m-1)$ where m is the symbol size. The Reed-Solomon code requires two parity symbols for every correction that it is designed to perform, such that n−k=2t. In other words, the size of the whole block minus the size of the data in the block equals the number of parity symbols. For Reed-Solomon error correction coding to function, every codeword must be different from every other codeword in at least 2t+1 positions. For example, if codeword A and codeword B are as close as possible to each other, and if codeword A has t errors that make it similar to codeword B, and codeword B has t errors in different positions that it make similar to codeword. A, then the two codewords will still have one symbol difference between them and they can be distinguished from each other. On the other hand, if either codeword has t+1 errors that make it similar to the other codeword, then the two codewords will be indistinguishable from each other and cannot be correctly decoded.

Table 1 shows example ECC parities for various seed values in which the LBA and data fields are zero:

TABLE 1

| LBA + Data + EDC | | | | | | Seed | ECC Parity | | | | | |
|---|---|---|---|---|---|---|---|---|---|---|---|---|
| 0 | 0 | 0 | ... | 0 | 0 | 0 | 0 | 0 | 0 | 0 | 0 | 0 |
| 0 | 0 | 0 | ... | 0 | 0 | 1 | a11 | a12 | a13 | a14 | a15 | a16 |
| 0 | 0 | 0 | ... | 0 | 0 | 2 | a21 | a22 | a23 | a24 | a25 | a26 |
| 0 | 0 | 0 | ... | 0 | 0 | 3 | a31 | a32 | a33 | a34 | a35 | a36 |
| 0 | 0 | 0 | ... | 0 | 0 | ... | | | | | | |
| 0 | 0 | 0 | ... | 0 | 0 | ... | | | | | | |

TABLE 1-continued

| LBA + Data + EDC | Seed | ECC Parity | | | | | |
|---|---|---|---|---|---|---|---|
| 0 0 0 ... 0 0 | ... | | | | | | |
| 0 0 0 ... 0 0 | ... | | | | | | |
| 0 0 0 ... 0 0 | | | | | | | |
| 0 0 0 ... 0 0 | | | | | | | |
| 0 0 0 ... 0 0 | x | ax1 | ax2 | ax3 | ax4 | ax5 | ax6 |
| 0 0 0 ... 0 0 | y | ay1 | ay2 | ay3 | ay4 | ay5 | ay6 |
| 0 0 0 ... 0 0 | z | az1 | az2 | az3 | az4 | az5 | az6 | where $x=2^m-2$, $y=2^m-1$ and $z=2^m$. The parity values are numbered to show their location in the table. The first number after 'a' is the line number and the second number is the parity symbol number. This table assumes that t=3. As discussed above, each line in this Table must be different in at least 2t+1 locations. All of the data is zero except for the seed value and the 2t parities. This means that no two rows in the Table will have exactly the same values in any column of the seed or the ECC parity values. If any two lines matched at any column of the seed or parity values, these two lines would only have 2t symbols different and would violate the rules of a Reed-Solomon code. This means that each symbol value from zero to z equals $2^m$ is used exactly once in each column. This also means that since the first line of the table is always all zeroes, none of the subsequent lines of the Table will have any zeroes in the seed or ECC parity columns.

This configuration is able to encode all possible data sets. For example, on one extreme, if the seed and the ECC parity contain only zero symbols, any of the lines in Table 1, 1 to z can be used, because none of them contain any zero symbols. Similarly, consider a case in which there is only one non-zero symbol in the seed and ECC parity. Regardless of the position in which the non-zero symbol occurs, all but one of the lines from 1 to z in Table 1 when added to the originally computed ECC symbols will change the zero symbols to non-zero symbols and leave the non-zero symbol as a non-zero symbol. The one line in Table 1 that will fail is the line that has the same value at the same position as the non-zero value in the original ECC symbol. Note that when adding Reed-Solomon encoded symbols, the addition function is similar to an exclusive OR, therefore the sum of a symbol with itself equals zero. Thus, every other line in the Table 1 will correct the run length constraint violation when added to a codeword that already contains only one non-zero symbol.

On the other hand, assuming that only one position in the original ECC parity symbols contains a zero, any line from 1 to z in Table 1 will make that zero value a non-zero value. However, some of the lines may convert currently non-zero values into zero values. Since all of the lines 1–z will make a zero symbol, a non-zero symbol assume that when the seed equals 1, one of the non-zero symbols of the ECC symbols is converted to a zero. If this occurs, then no other line in the Table will make that particular symbol a zero, because the symbol that made the parity in that particular position go to zero only exists in that one line of the Table. Every other line in the Table has a different symbol in that position. Similar statements can be made for all of the other lines 2–z in Table 1. By definition, the number of Reed-Solomon code symbols, $2^m$ (number of symbols or seeds) must be greater than the number of parities 2t, because the largest block size is $2^m-1$ and there is no situation in which an entire block contains parity with no data. Because there are only 2t+1 symbols (including the seed) that can be zero, but $2^m$ ways to choose a seed, we are guaranteed that at least $2^m-2t$ ways to eliminate all zero symbols from the ECC parity. Continuing with the example, when the seed equals one there may be two non-zero symbols which are converted to zeroes, but no other line in the Table will cause those two symbols to be zeroed out. It will therefore take fewer iterations to find an acceptable seed. Therefore, there will always be at least one line in Table 1 that will make all of the ECC parity symbols non-zero.

During decode, one technique that can be employed is to assume that the seed is zero. If this assumption is false, one level of error correcting code can be used to correct the seed and complete the decoding. Although this will reduce the maximum amount of error correction, the probability that t corrections will be required versus t−1 corrections is very small for t greater than 5% of the codeword length. Therefore, the ECC coding level sacrifice is marginal. On the other hand, if multiple interleaves are used, a single correction per interleave is much more important. In such a situation, the decode operation can cycle through seeds after reading data if the ECC fails until the correct seed symbol is reached.

The configuration of the present invention will eliminate the need for a second RLL code when Reverse ECC (CCE) is used. The savings can be, for example, 23,000 to 30,000 gates on a typical controller chip. The scheme is also easily implemented. In a slightly more complex system, symbols that are adjacent to zero symbols can be checked to see whether the seed requires adjustment. That is if the symbols adjacent to the zero symbol have ones in the bits closest to the zero symbol, the seed may not need to be adjusted. This technique can be extended to further reduce the k constraint.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement or selection of parts within the principles of the present invention to the full extent indicated by the broad general meaning of the terms in which the appended claims are expressed. For example, the particular elements may vary depending on the particular application for the data change while maintaining substantially the same functionality without departing from the scope and spirit of the present invention. In addition, although the preferred embodiment described herein is directed to a system for storing data, it will be appreciated by those skilled in the art that the teachings of the present invention can be applied to any system that uses a data channel, such as a communication system, without departing from the scope and spirit of the present invention. As used herein, "seed" is defined above and includes any symbol, bit, word or other data inserted in to the channel data which is selected to meet a desired RLL constant.

What is claimed is:

1. A method for communicating data comprising:
RLL encoding the data in accordance with a run length limited (RLL) code; and
placing a seed in the RLL encoded data, the seed selected to provide error correction code (ECC) parity in accordance with an RLL constraint to thereby generate channel data.

2. The method of claim 1 wherein the RLL constraint requires an ECC parity having no zero symbols.

3. The method of claim 1 including scrambling and error detection coding (EDC) the user data prior to RLL encoding.

4. The method of claim 1 including selecting the seed based upon an occurrence of a zero symbol in the ECC parity.

5. The method of claim 1 including iteratively testing seeds to identify a seed which satisfies the RLL constraint.

6. The method of claim 1 including calculating initial ECC parity symbols based upon the seed.

7. The method of claim 6 including determining a second set of ECC parity symbols based upon a new seed.

8. The method of claim 7 wherein the second set of ECC parity symbols is determined by addition with a codeword.

9. The method of claim 8 including retrieving the codeword from a memory.

10. The method of claim 1 including decoding the channel data by selecting a decode seed and RLL decoding the ECC parity data.

11. The method of claim 10 including correcting decode errors due to an incorrect decode seed.

12. The method of claim 10 including selecting a different decode seed if there are decode errors.

13. The method of claim 1 wherein the seed is appended to the RLL encoded data.

14. The method of claim 1 wherein the seed is placed anywhere in the RLL encoded data.

15. The method of claim 1 wherein the seed is used to compute the ECC parity and is transmitted with the channel data.

16. The method of claim 1 wherein the seed is used to compute the ECC parity and is not transmitted with the channel data.

17. The method of claim 1 including storing the channel data on a storage medium.

18. The method of claim 10 including retrieving the channel data from a storage medium prior to decoding the channel data.

19. A system for communicating data comprising:
a run length limited (RLL) encoder configured to RLL encode user data;
a seed selection module configured to select a seed for placement in the RLL encoded data to provide an error correction code (ECC) parity in accordance with an RLL constraint to generate channel data.

20. The apparatus of claim 19 wherein the RLL constraint requires an ECC parity having no zero symbols.

21. The apparatus of claim 19 wherein the seed selection module iteratively tests seeds to identify a seed that satisfies the RLL constraint.

22. The apparatus of claim 19 wherein the seed selection module calculates an initial parity based upon the seed.

23. The apparatus of claim 22 wherein the seed selection module determines a second ECC parity based upon a new seed.

24. The apparatus of claim 23 wherein the seed selection module determines the second ECC parity by addition of a code word.

25. The apparatus of claim 24 wherein the seed selection module retrieves the codeword from a memory.

26. The apparatus of claim 19 including a decoder for decoding the channel data.

27. The apparatus of claim 26 wherein the decoder selects a seed for use in decoding the channel data.

28. The apparatus of claim 27 wherein the decoder uses an error correction code to correct errors in the decoded data due to incorrect decode seed.

29. The apparatus of claim 27 wherein the decoder iteratively selects decode seeds.

30. The apparatus of claim 19 including a storage medium for storing the channel data.

31. The apparatus of claim 30 wherein the storage medium comprises a disc.

* * * * *